(12) United States Patent
Matsumoto et al.

(10) Patent No.: US 7,583,475 B2
(45) Date of Patent: Sep. 1, 2009

(54) ROTATING DISK STORAGE DEVICE AND INTEGRATED WIRE HEAD SUSPENSION ASSEMBLY

(75) Inventors: Yuhsuke Matsumoto, Kanagawa (JP);
Tatsumi Tsuchiya, Kanagawa (JP);
Takaaki Murokawa, Kanagawa (JP);
Yoshio Uematsu, Kanagawa (JP);
Tatsushi Yoshida, Chigasaki (JP);
Nobuyuki Hashi, Kanagawa (JP);
Hiroyasu Tsuchida, Kanagawa (JP);
Takuma Muraki, Kanagawa (JP)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 859 days.

(21) Appl. No.: 11/066,949

(22) Filed: Feb. 25, 2005

(65) Prior Publication Data

US 2005/0199680 A1    Sep. 15, 2005

(30) Foreign Application Priority Data

Feb. 26, 2004  (JP)  .............................. 2004-051845

(51) Int. Cl.
*G11B 5/48*    (2006.01)
(52) U.S. Cl. .................................. 360/245.9
(58) Field of Classification Search .............. 360/245.8, 360/245.9, 234.5
See application file for complete search history.

(56) References Cited

U.S. PATENT DOCUMENTS

| | | | | |
|---|---|---|---|---|
| 4,761,699 A | * | 8/1988 | Ainslie et al. | 360/234.5 |
| 5,828,031 A | * | 10/1998 | Pattanaik | 219/121.63 |
| 6,742,694 B2 | * | 6/2004 | Satoh et al. | 228/41 |
| 6,871,392 B2 | * | 3/2005 | Tsuchiya et al. | 29/603.03 |
| 6,956,722 B2 | * | 10/2005 | Wada et al. | 360/245.8 |
| 7,116,523 B2 | * | 10/2006 | Lee et al. | 360/245.9 |

FOREIGN PATENT DOCUMENTS

| | | |
|---|---|---|
| JP | 2002-025025 | 1/2002 |
| JP | 2002-251705 | 9/2002 |
| JP | 2003-123217 | 4/2003 |

\* cited by examiner

*Primary Examiner*—Angel A. Castro
(74) *Attorney, Agent, or Firm*—Townsend and Townsend and Crew LLP; John Henkhaus

(57) ABSTRACT

Embodiments of the invention provide techniques to prevent, when a bonding pad and a lead wiring pad are to be connected using a solder ball, the solder ball from deviating from a centerline and a soldering problem from occurring. In one embodiment, a head suspension assembly includes a solder ball disposed between a lead wiring pad provided for a flexure and a bonding pad provided for a slider. The solder ball is then melted for making a soldered joint between the lead wiring pad and the bonding pad. A through slot is provided at a position near a centerline on a front surface of the lead wiring pad. The solder ball is dropped into the through slot by gravity from the front surface of the lead wiring pad. A contact area in contact with the solder ball is thereby secured on a side of the slider.

17 Claims, 14 Drawing Sheets

ROTATING DISK STORAGE DEVICE AND INTEGRATED WIRE HEAD SUSPENSION ASSEMBLY

CROSS-REFERENCES TO RELATED APPLICATIONS

This application claims priority from Japanese patent application No. JP2004-051845, filed Feb. 26, 2004, the entire disclosure of which is incorporated herein by reference.

BACKGROUND OF THE INVENTION

The present invention generally relates to a rotating disk storage device and an integrated wire head suspension assembly. The invention relates more particularly to an integrated wire head suspension assembly that can improve upon an inconvenience involved in bonding a lead wiring pad provided on an end portion of a lead of the head suspension assembly to a bonding pad provided in a slider of the head suspension assembly, and a rotating disk storage device that uses the integrated wire head suspension assembly.

With hard disk devices becoming smaller and smaller these years, requirements have become even more stringent for design and manufacture of different parts of suspensions that move magnetic heads. Connecting a lead to a slider having a magnetic head, in particular, has become an extremely difficult job to perform. In addition, the weight of the lead itself, a lead wiring position, and the like have come to affect head control. An integrated wire suspension, which suppresses variations caused by wiring through bonding a wire portion on the suspension or forming a wire pattern thereon, is now known.

In the integrated wire suspension, it is necessary to connect a lead wiring pad provided on a flexure portion on the suspension side with a bonding pad provided on the slider. The connection surface between the lead wiring pad and the bonding pad is such that planes formed by extending the two pads are perpendicular to each other (that is, a virtual right angle is formed at an intersection point of the two planes as viewed from a side). Various new techniques are employed, since a technique used for connecting ordinary opposing surfaces is not effective in connecting the two surfaces running at right angles to each other.

One known technique used for joining the lead wiring pad with the bonding pad, each having an orthogonal positional relation with each other, is, for example, apple bonding that uses a gold (Au) ball. In apple bonding, a gold ball is pressed against the virtual right angle formed between the lead wiring pad and the bonding pad. The gold ball is then subjected to ultrasonic welding to make a connection between the two pads. Another technique, for example, a technique using a solder ball, is disclosed (see, for example, Japanese Patent Laid-Open No. 2003-123217).

The technique using the solder ball proceeds as follows. Specifically, the integrated wire suspension is supported so that the virtual right angle formed by the two pads faces upward in a vertical direction. The solder ball is then disposed between the two pads. The solder ball is thereafter irradiated with a laser beam, which melts the solder so as to form a soldered connection between the two pads.

FIG. 13 shows how the lead wiring pad and the bonding pad are joined together using the solder ball in a conventional integrated wire suspension.

A flexure 101 of the suspension is of a dual-layer structure including a polyimide layer 102 of a high polymeric material having insulating properties and a stainless steel foil layer 103. Leads 104 are formed as a conductor layer on top of the polyimide layer 102. Lead wiring pads 105 are formed on distal ends of the leads 104. The lead wiring pads 105 are formed to have a wider width than the leads 104 do to provide sufficient areas for solder connections.

The polyimide layer 102 and the stainless steel foil layer 103 can be formed into corresponding desired shapes by, for example, etching the layers after required portions have been covered with a resist. If the polyimide layer 102 is a photosensitive polyimide layer, required portions of the photosensitive polyimide layer 102 are covered with a resist or the like before the layer is subjected to exposure and developing processes. The photosensitive polyimide layer 102 can then be formed into a desired shape.

An opening portion 106 is formed on leading end portions of the lead wiring pads 105 in the flexure 101. This is done to prevent an excess adhesive from sticking to the lead wiring pads 105 when the slider is bonded to the suspension. Or, the opening portion 106 is provided to prevent the high polymer polyimide layer 102 from being changed by heat generated through radiation of the laser beam. The leading end portions of the lead wiring pads 105 are therefore aerially wired, protruding in the opening portion 106. U-shaped cutout portions 107 are formed in the lead wiring pads 105. The cutout portion 107 lets a solder ball 200 fall from a front surface of the lead wiring pad 105 onto an area near a centerline of the front surface of the lead wiring pad 105 by gravity.

A slider 108 having a hard disk magnetic head built therein is mounted to the flexure 101. As described in the foregoing, bonding pads 109 of the slider 108 are disposed at positions perpendicular to the lead wiring pads 105. This means that a plane formed by extending a surface of the bonding pad 109 crosses a plane formed by extending a surface of the lead wiring pad 105. Virtual axes that run at right angles to each other therefore form 90 degrees (right angle) at the intersection point.

When the bonding pad 109 and the lead wiring pad 105 are connected with the solder ball 200, the suspension (flexure 101) is secured so that the virtual right angle formed by the bonding pad 109 and the lead wiring pad 105 opens to face upward in the vertical direction. The flexure 101 is usually secured in position as follows. Specifically, the lead wiring pad 105 on the flexure 101 and the bonding pad 109 on the slider 108 rise in a direction of 45 degrees from a horizontal plane, while each maintaining an orthogonal positional relation with each other. A solder ball loading device (not shown) is then used to drop the solder ball 200 onto an area between the two pads that have been secured in position. The solder ball 200 is then heated and melted using a laser beam radiation device (not shown) to make a soldered joint between the two pads.

The conventional integrated wire suspension employed the steps as described in the foregoing to connect the bonding pad 109 with the lead wiring pad 105 using the solder ball 200.

The integrated wire suspensions are available in the following three types according to a manufacturing method employed. In any of the manufacturing methods, the steps as described in the foregoing are followed to connect the bonding pad 109 with the lead wiring pad 105 using the solder ball 200. The three types are:

(a) An additive type, in which copper foil wires and pads are added on an insulator of the suspension;

(b) A subtractive type, in which wires and pads are formed by etching a copper foil formed in a sheet on the insulator of the suspension; and (c) An FPC type, in which a flexible printed circuit board (FPC), on which copper foil wires and pads are formed, is bonded to the suspension.

BRIEF SUMMARY OF THE INVENTION

In the conventional integrated wire suspension described above, the U-shaped cutout portions 107 are provided in the lead wiring pads 105 to achieve the following purpose. Specifically, when the bonding pad 109 and the lead wiring pad 105 are to be connected using the solder ball 200, the cutout portion 107 prevents the solder ball 200 dropped from the front surface of the lead wiring pad 105 onto the area near the centerline of the front surface of the lead wiring pad 105 from rolling to deviate from the centerline. This, however, posed the problem that the solder was not fused in an open portion of the U-shaped cutout portion 107. This represents a property of a molten solder as detailed in the following. Specifically, when the solder is melted by irradiating the solder ball 200 with a laser beam, the molten solder tends to be attracted to an area having a wider contact area. Wettability of the solder then causes a greater part of the molten solder to spread onto a bonding surface of the bonding pad 109 that has no opening portions. As a result, the solder sticks only to one of arms of the U-shaped cutout portion 107 of the lead wiring pad 105. The solder may even stick to neither arms of the U-shaped cutout portion 107. The U-shaped cutout portion 107 contributed to these soldering problems.

FIG. 14 depicts the lead wiring pad 105 having another arrangement. The lead wiring pad 105 as depicted in FIG. 14 is provided with a recess 110 at an area near a centerline on a front surface thereof. The recess 110 lets the solder ball 200 fall therein from the front surface of the lead wiring pad 105 by gravity. The recess 110 allows the solder ball 200 to make contact with a bottom surface thereof. The recess 110 therefore prevents the solder ball 200 dropped from the front surface of the lead wiring pad 105 from rolling to deviate from the centerline. In addition, the recess 110 helps make wettability of the molten solder work favorably as follows. Specifically, substantially the same size of the molten solder spreads over the bonding surface of the bonding pad 109 and the recess 110 that serves as the bonding surface of the lead wiring pad 105. The two pads can thus be connected properly.

To form the recess 110 in the lead wiring pad 105, however, it is common practice to employ half etching so as not to allow the recess 110 to extend through. In the subtractive manufacturing method, resist masks must be exchanged between when forming the half-etched portion and when forming the peripheral. This poses a new problem of the increased number of manufacturing processes.

A feature of the present invention is to provide an integrated wire suspension that prevents not only the solder ball from deviating from the centerline when the bonding pad and the lead wiring pad are connected together using the solder ball, but also soldering problems from occurring. It is another feature of the present invention to provide a rotating disk storage device using the integrated wire suspension.

A rotating disk storage device according to a first embodiment of the present invention includes a rotating disk storage medium, a head/slider, and a head suspension assembly. The head/slider includes a head that accesses the rotating disk storage medium and a slider mounted with the head. The head suspension assembly includes a mounting portion of the head/slider, wires connected to the head/slider, and a lead wiring pad that forms an end portion of the wires. The lead wiring pad is provided with a through slot for positioning a solder ball used for connection to the head/slider.

A rotating disk storage device according to a second embodiment of the present invention includes a rotating disk storage medium, a head/slider, and a head suspension assembly. The head/slider includes a head that accesses the rotating disk storage medium and a slider mounted with the head. The head suspension assembly includes a mounting portion of the head/slider, wires connected to the head/slider, and a lead wiring pad that forms an end portion of the wires. The lead wiring pad is provided with a positioning portion for positioning a solder ball in a vertical direction relative to a centerline of the lead wiring pad, a through opening having the positioning portion defined as an edge thereof, and a contact area in contact with the solder ball and provided on a head/slider side of the through opening.

A rotating disk storage device according to a third embodiment of the present invention includes a rotating disk storage medium, a head/slider, and a head suspension assembly. The head/slider includes a head that accesses the rotating disk storage medium and a slider mounted with the head. The head suspension assembly includes a mounting portion of the head/slider, wires connected to the head/slider, and a lead wiring pad that forms an end portion of the wires. The lead wiring pad includes a recess indented from a front surface of the lead wiring pad for positioning a solder ball used for connection to the head/slider and a contact area in contact with the solder ball and provided on an end portion on a head/slider side of the lead wiring pad to define an edge of the recess.

A rotating disk storage device according to a fourth embodiment of the present invention includes a rotating disk storage medium, a head/slider, and a head suspension assembly. The head/slider includes a head that accesses the rotating disk storage medium and a slider mounted with the head. The head suspension assembly includes a mounting portion of the head/slider, wires connected to the head/slider, and a lead wiring pad that forms an end portion of the wires. A through slot is formed in the lead wiring pad. The through slot is provided with a wider width in a portion extending from a portion near the head/slider than in a portion far away therefrom.

An integrated wire head suspension assembly according to a fifth embodiment of the present invention includes a lead wiring pad formed on an end portion of a wire pattern formed by a metal layer, a dielectric layer laminated on top of the metal layer, and a conductor layer laminated on top of the dielectric layer. The lead wiring pad is provided with a through slot for positioning a solder ball used for connection to a slider mounted with a head that accesses a rotating disk storage medium.

In the rotating disk storage device and the integrated wire head suspension assembly according to the embodiments of the present invention, the lead wiring pad is provided with the through slot, or the through opening or the recess that includes the contact area in contact with the solder ball, in order to position the solder ball used for connection to the head. This arrangement achieves the following purpose. Specifically, when the solder ball is dropped onto the through slot, or the through opening or the recess, in the lead wiring pad using gravity, the solder ball can be brought into contact with the bonding surface formed at the leading end (a portion closer to the head/slider) of the lead wiring pad for the through slot. Or, the solder ball can be brought into contact with the contact area in contact with the solder ball for the through opening or the recess. For the through slot, therefore, when the solder ball dropped between the bonding pad and the lead wiring pad is melted by being irradiated with a laser beam, the resultant molten solder spreads over the bonding surface formed at the leading end (the portion closer to the head/slider) of the lead wiring pad because of wettability of the solder involved. For the through opening or the recess, on the other hand, the resultant molten solder spreads over the contact area in contact with the solder ball because of the wettability of the solder involved. Regardless of whether the through slot, or the through opening or the recess, is provided in the lead wiring pad for letting the solder ball fall onto, therefore, the molten solder spreads over both the bonding surface of the bonding pad and the bonding surface of the lead wiring pad because of the wettability of the solder involved. In either case, the two pads can be joined properly without allowing any soldering problem to occur.

Even if a head suspension assembly of the subtractive type called an ILS (Integrated Lead Suspension) is adopted, the lead wiring pad can be formed, while forming at the same time the entire peripheral surface using a single resist mask for the through slot or the through opening. This involves no increase in the number of manufacturing processes.

The present invention can provide a rotating disk storage device and an integrated wire head suspension assembly that exhibit good performance in retaining the solder ball and providing good solder connections. In addition, the present invention can easily form a head suspension assembly without involving an increase in the number of manufacturing processes even if the subtractive type called the ILS is employed.

DETAILED DESCRIPTION OF THE INVENTION

Figure 1:
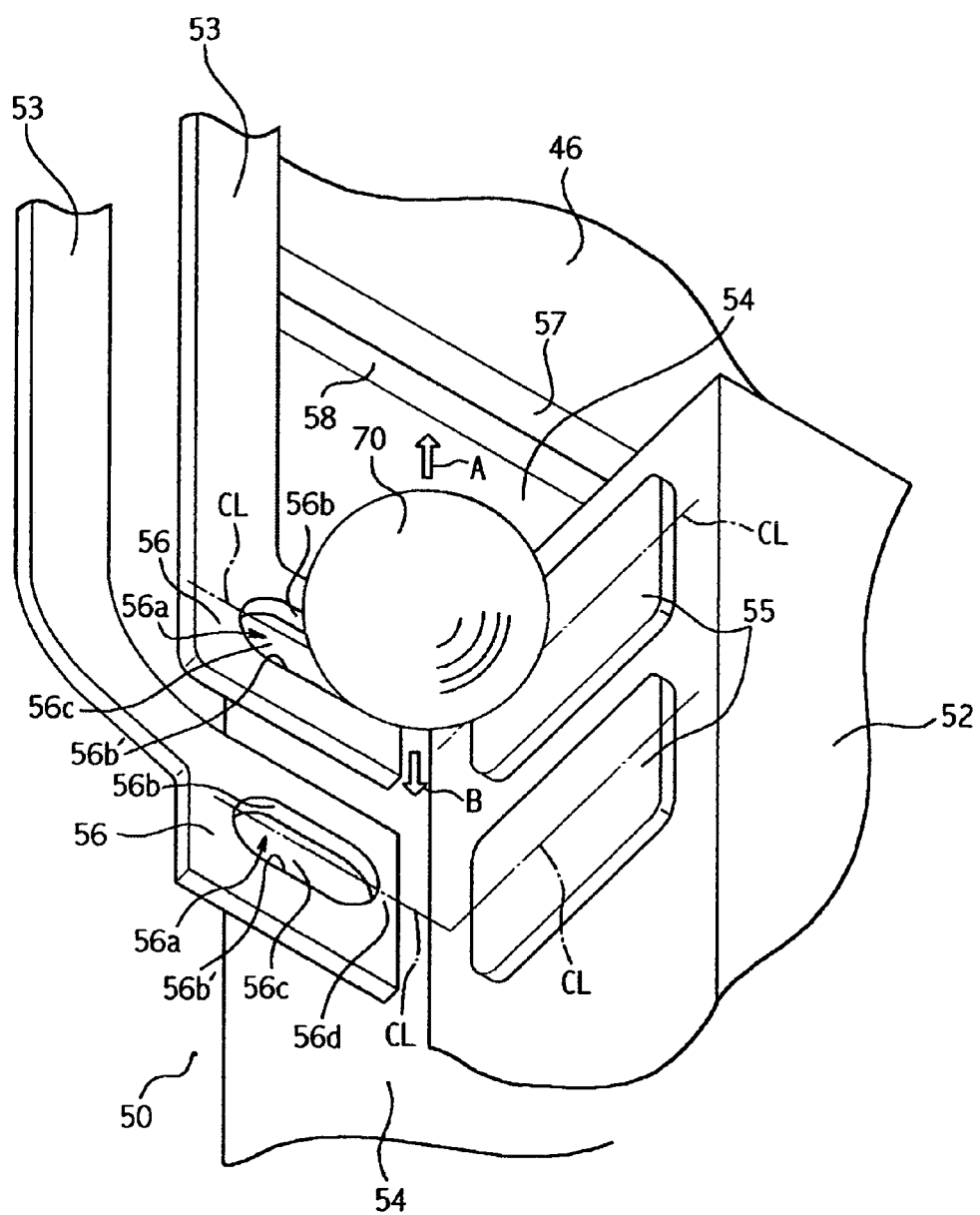
FIG. 1 is a perspective view showing a head suspension assembly according to an embodiment of the present invention.
Figure 2:
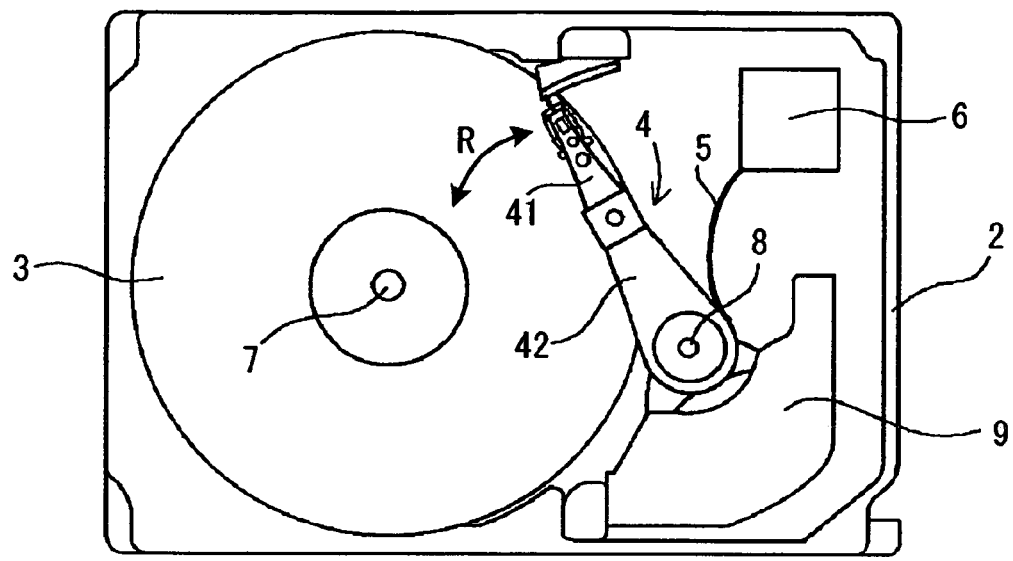
FIG. 2 is a view for explaining the construction of a rotating disk storage device.
Figure 3:
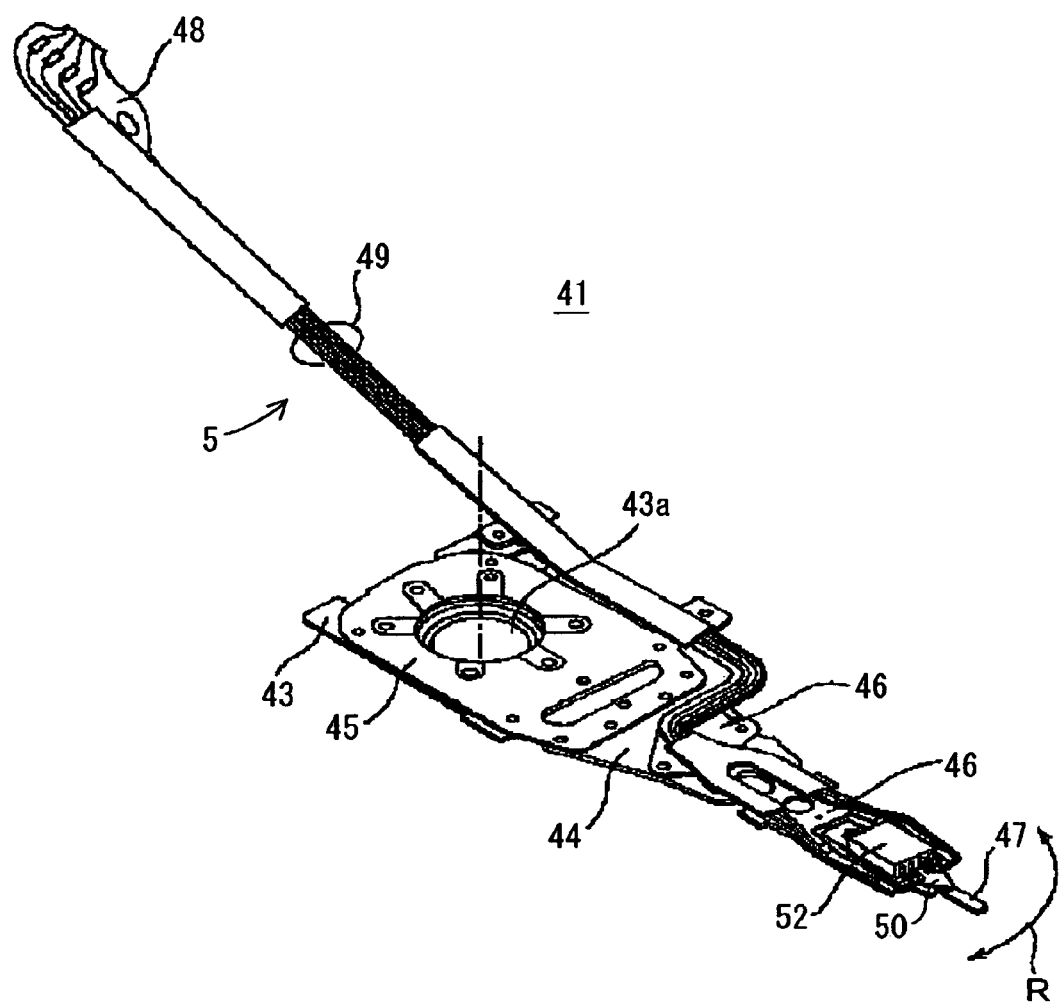
FIG. 3 is a perspective view showing the overall construction of the head suspension assembly.
Figure 4:
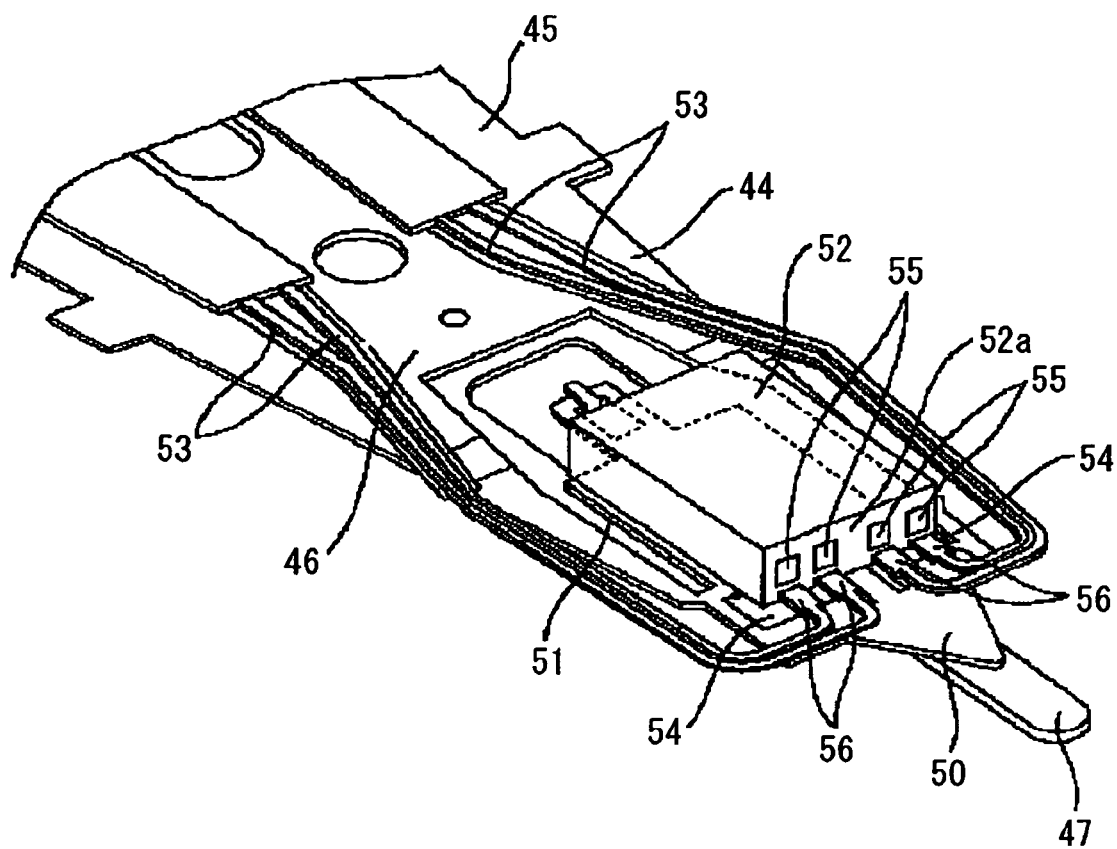
FIG. 4 is a partial enlarged perspective view showing a leading end portion in the head suspension assembly shown in FIG. 3, at which a slider is disposed.

Rotating disk storage devices and integrated wire head suspension assemblies according to specific embodiments of the present invention will be described with reference to the accompanying drawings. FIG. 1 is a view showing a major part of a head suspension assembly according to an embodiment of the present invention. FIG. 1 is a perspective view showing, in an enlarged view, a portion of bonding between a lead wiring pad and a bonding pad using a solder ball. FIG. 2 is a plan view showing the construction of a magnetic disk device. FIG. 3 is a perspective view showing the overall construction of the head suspension assembly. FIG. 4 is a partial enlarged view showing a leading end portion in the head suspension assembly shown in FIG. 3, at which a slider is disposed. Similar reference numerals have been used throughout the entire drawings relevant to the specification to denote similar parts.

A magnetic disk device or a rotating disk storage device according to an embodiment of the present invention shown in FIG. 2 includes the following components. The components are housed in a closed space of clean ambience formed by a housing 2 and a cover (not shown) that covers an upper portion of the housing 2. The components specifically include, as examples: a magnetic disk 3 of a disk shape that serves as a rotating disk storage medium; an actuator head suspension assembly 4; a flexible cable 5; and a control unit 6 mounted to the flexible cable 5.

The magnetic disk 3 is screwed to a rotor portion of a spindle motor (not shown) disposed in parallel with a bottom surface of the housing 2 and provided therein. The magnetic disk 3 spins about a spindle shaft 7 as driven by the spindle motor.

The actuator head suspension assembly 4 includes a head suspension assembly (HSA) 41 and an actuator assembly 42.

The HSA 41 may, for example, be an integrated wire suspension as shown in FIG. 3. The HSA 41 includes, as major components thereof, a base plate 43, a load beam 44, a suspension plate 45, and a flexure 46. An opening portion 43a is formed in the base plate 43. The HSA 41 is held by the actuator assembly 42 through the opening portion 43a. The actuator assembly 42 includes an actuator arm (not shown) that supports the HSA 41, a bearing portion of a pivot shaft 8, and a voice coil motor (VCM) 9. The actuator assembly 42 causes the HSA 41 to pivot about the pivot shaft 8 in a direction shown by an arrow R. The VCM 9 includes a coil support, a voice coil supported by the coil support, and a yoke.

The suspension plate 45 is bonded to the base plate 43. The load beam 44 is secured to the suspension plate 45. The suspension plate 45 is elastically supported by the base plate 43. The opening portion 43a formed in the base plate 43 provides the suspension plate 45 with a required suspension characteristic. The load beam 44 extends radially from the rotary shaft that turns the integrated wire suspension 41. There is formed a tab 47 at a leading end portion of the load beam 44.

The flexure 46 is a lead holding mechanism that extends in a cranked form from a leading end portion to a multi-connector portion 48 of the HSA 41. The flexure 46 is laser-welded to the load beam 44 and secured also to the base plate 43. Four leads 49, for example, are disposed on a top surface (the surface located on an upper side in FIG. 3) of the flexure 46. The four leads are disposed in a manner that one is prevented from contacting another by means of an insulation sheet interposed therebetween. These leads 49 are provided with a protective sheet (not shown) protecting critical portions thereof, functioning as the flexible cable 5.

A portion near a leading end of the flexure 46 is secured to the load beam 44. A portion of the leads beyond this fixing portion is free from the load beam 44, where there is formed an opening portion of an arch shape. Referring to FIG. 4, a flexure tongue 51 is formed so as to protrude from a platform 50 at an extreme leading end portion of the flexure 46 toward a center of the arch-shaped opening portion. A slider 52 is bonded to the flexure tongue 51. The flexure tongue 51 is supported by a pivot not shown protruded from the load beam 44 at a position that corresponds to a central portion of the slider 52. This allows the slider 52 to have a predetermined amount of inclination (referred to as pitch, roll, and yaw) in all directions relative to the load beam 44. The slider 52 includes a head (not shown) that reads data from and writes data onto the magnetic disk 3, or that either reads data from or writes data onto the magnetic disk 3. Hereinafter, the slider 52 with the read/write head is referred to as a head/slider 52.

The four leads 49 shown in FIG. 3 are divided into two pairs of leads 53, starting with an area where the leads 49 have just come out of the protective sheet as shown in FIG. 4. Each pair of the leads 53 runs toward the extreme leading end portion. The pair then bends substantially at right angles in an aerial position along a side face portion of an opening portion 54 provided at the leading end portion of the flexure 46. The pair finally reaches the platform 50. Further, each pair of the leads 53 bends, on the platform 50, a second time substantially at right angles toward four bonding pads 55 formed in an extreme leading end side face 52a of the head/slider 52.

A lead wiring pad 56 is formed at a distal end of each of the bent leads 53. A total of four lead wiring pads 56 are to be connected to the four bonding pads 55 formed in the extreme leading end side face 52a of the head/slider 52. The opening portion 54 is formed at a solder connection that joins the bonding pads 55 to the lead wiring pads 56 between the platform 50 and the flexure tongue 51.

A method for connecting the bonding pads 55 with the lead wiring pads 56 using a solder ball will next be described.

The connection procedure generally follows the steps as follows. First of all, the HSA 41 is supported so that a right angle formed at an intersection point between a front surface (a connection surface) of the bonding pad 55 and a front surface (a connection surface) of the lead wiring pad 56 faces upward in a vertical direction. Next, the solder ball is disposed between the two pads. The solder ball is then irradiated with a laser beam, thereby making a connection between the two pads.

In the first place, the method employed for supporting the HSA 41 so that the right-angled portion formed between the front surface of the bonding pad 55 and the front surface of the lead wiring pad 56 faces upward in the vertical direction will be described in detail.

Figure 5:
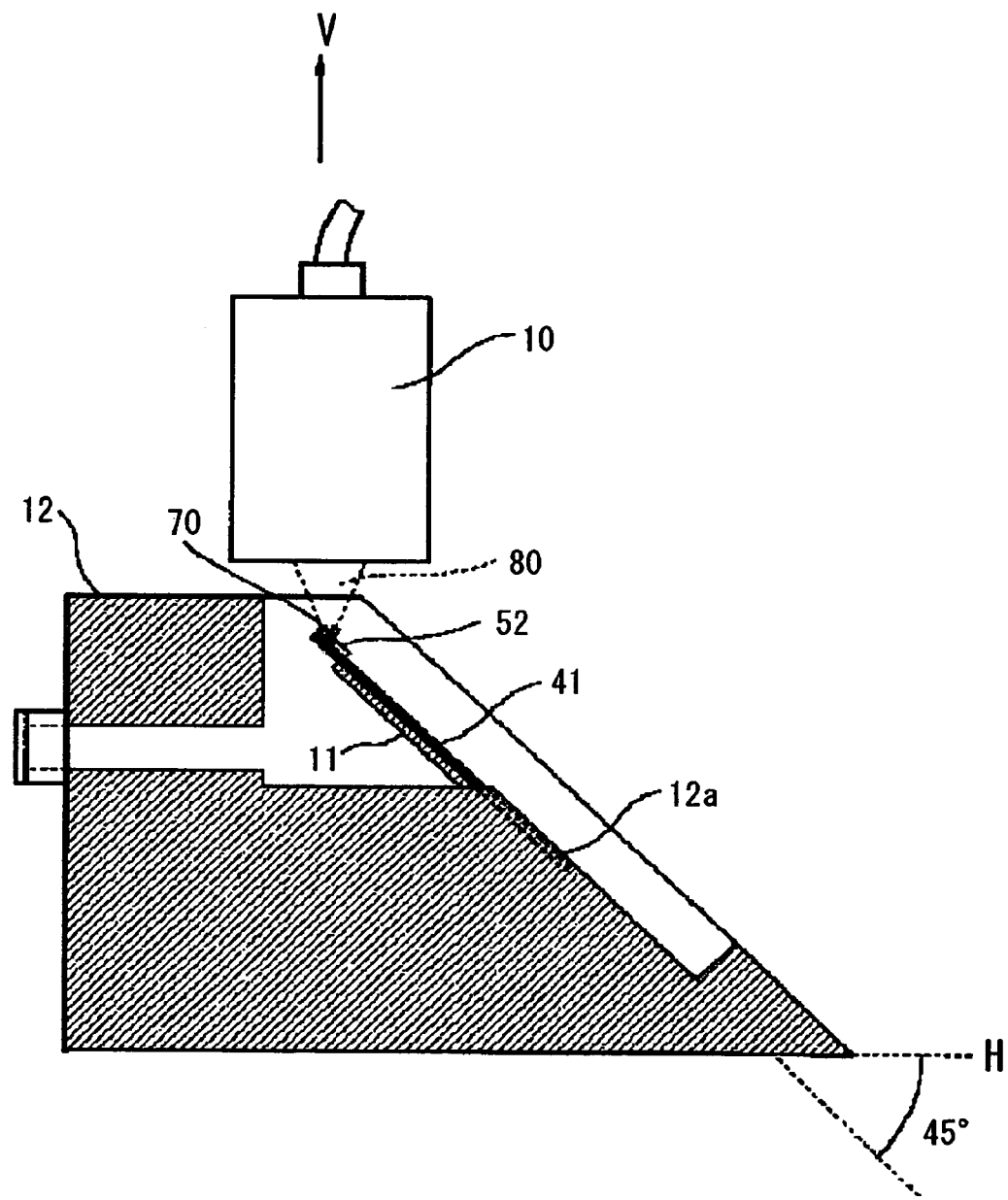
FIG. 5 is a view showing a solder ball bonding device that joins together the two pads by irradiating a solder ball disposed between the two pads with a laser beam.

FIG. 5 is a view showing a solder ball bonding device that joins together the two pads by irradiating a solder ball 70 disposed between the two pads with a laser beam. FIG. 5 shows the layout of major components of the solder ball bonding device. The major components include: optical (laser) equipment 10 that approaches the solder ball 70 to irradiate the solder ball 70 with a laser beam 80; a working jig 11 that holds the HSA 41; and a work pedestal 12 that holds the working jig 11.

The work pedestal 12 has a work surface 12a having an inclination of 45 degrees relative to a horizontal plane H. The working jig 11 is disposed on the work surface 12a so as to have an inclination of 45 degrees relative to the horizontal plane H. Further, the HSA 41 is mounted on the working jig 11 with the head/slider 52 on the upper side and the slider 52 facing upward.

At this time, the HSA 41 held in the working jig 11 takes the following position. Specifically, the bonding surfaces of the bonding pads 55 on the leading edge portion of the HSA 41 and the bonding surfaces of the lead wiring pads 56 that oppose thereto take an angle of substantially 45 degrees relative to the horizontal plane H. As such, a virtual right-angled portion formed by the front surfaces of the bonding pads 55 and the front surfaces of the lead wiring pads 56 is held so as to be opened to face upward in a vertical direction V on the working jig 11.

The solder ball 70 is next disposed between the two pads. The solder ball 70 is thereafter irradiated with the laser beam 80. The method for irradiating the solder ball 70 disposed between the two pads with the laser beam 80 is disclosed in detail in Japanese Patent Application Nos. 2000-189148 and 2001-039888. Only general descriptions will be given for the method for disposing the solder ball 70, the construction of the optical equipment 10, and the like, since these are not directly associated with the present invention.

The optical equipment 10 is a fiber laser termination module that uses an optical fiber as a resonator. The optical equipment 10 includes a series of optics lenses disposed along an internal optical path, forming a hollow laser beam path space. The optics lenses focus divergent light rays output from the optical fiber into a laser beam. The laser beam 80 is then output from a leading end portion of the optical equipment 10.

Figure 6:
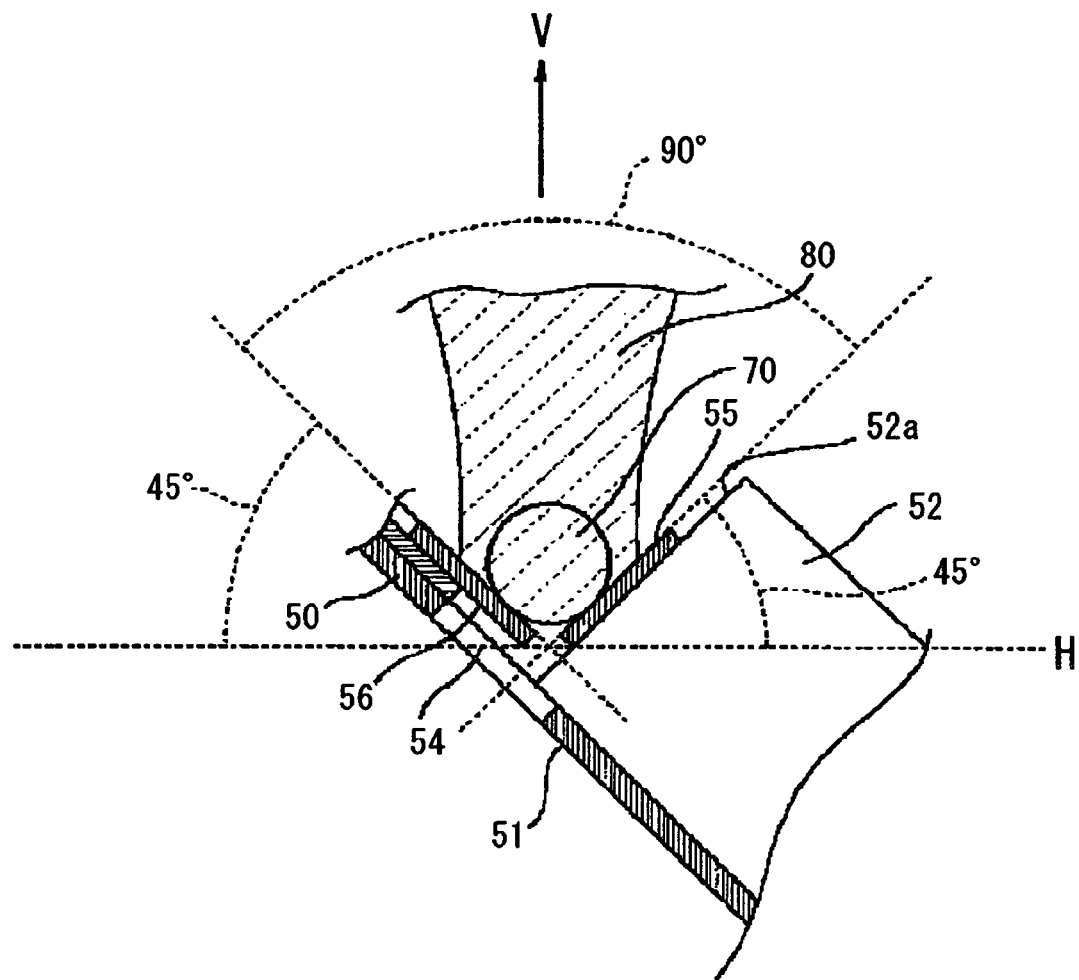
FIG. 6 is an enlarged view for explaining the condition of the solder ball placed at the leading end portion of the head suspension assembly held in position by the working jig shown in FIG. 5.

FIG. 6 is an enlarged cross-sectional view showing the solder ball 70 placed at the leading end portion of the HSA 41 held in position by the working jig 11 shown in FIG. 5.

Each of the bonding pad 55 and the lead wiring pad 56 is disposed so as to rise to an angle of about 45 degrees from the horizontal plane. A surface extended from the front surface of the bonding pad 55 runs substantially perpendicularly with respect to a surface extended from the front surface of the lead wiring pad 56. There is a virtual right angle formed between the two pads. The virtual right angle is open to face upward in the vertical direction V. The angle is appropriately set to receive the solder ball 70 supplied from the above.

The solder ball 70 being transported by a suction pad is placed to be in contact with the bonding surface of each of the bonding pad 55 and the lead wiring pad 56. When the solder ball 70 thus placed comes to a standstill, the optical equipment 10 moves to a laser emission position by using a moving mechanism (not shown). The optical equipment 10 then emits a focused laser beam 80, having a predetermined spot diameter, to the solder ball 70.

A predetermined amount of nitrogen gas N2 for achieving an inert gas ambience to suppress oxidation of the solder is injected from a nitrogen gas introduction pipe of the work pedestal 12 at timing between the placement of the solder ball 70 and emission of the laser beam 80. Thereby the bonding pad 55, the lead wiring pad 56, and the solder ball 70 are placed in the inert gas ambience. When the nitrogen gas is injected, consideration is given to an injection position and a flow velocity of the gas to prevent the stationary solder ball 70 from being moved by a wind blast at the time of injection.

Nonetheless, the solder ball 70 can be moved by the injection of the nitrogen gas depending, for example, on a surface condition of the pads.

While the inert gas ambience is maintained, the optical equipment 10 emits the laser beam 80 to heat and melt the solder ball 70. The bonding pad 55 and the lead wiring pad 56 are thereby joined together. The spot diameter of the laser beam 80 at this time is set to about 150 to 200 μm if the outside diameter of the solder ball 70 measures about 120 μm. In application, the solder ball 70 commonly has an outside diameter of 80 μm, 110 μm, or 130 μm.

The solder is melted in the inert gas ambience of the nitrogen gas N2 as described in the foregoing. This means that the inert nitrogen gas N2 covers the surface of the solder for the period from melting to cooling of the solder and making of a soldered joint. Oxidation of the solder can thus be prevented.

Figure 7:
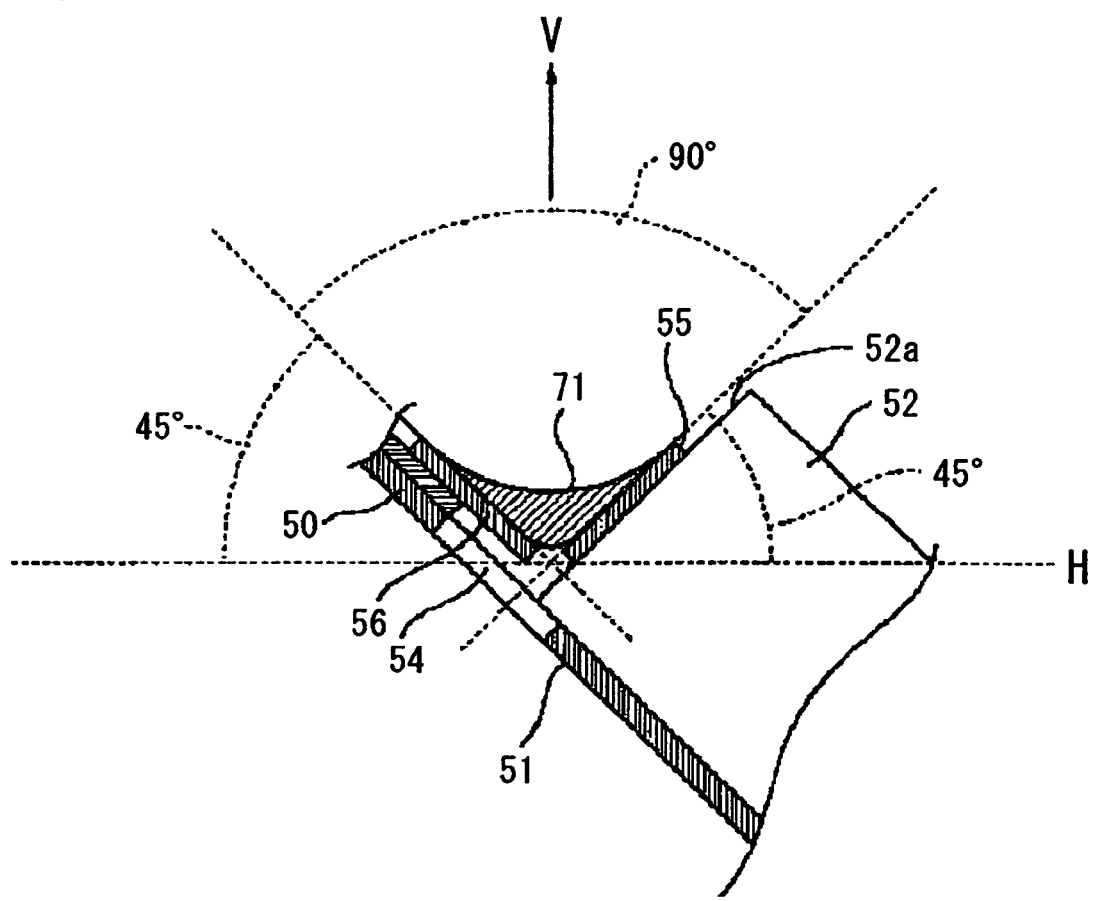
FIG. 7 is an enlarged view for explaining a condition, in which the solder ball shown in FIG. 6 has been melted to join the bonding pad and the lead wiring pad.

FIG. 7 is an enlarged cross-sectional view showing a condition, in which the solder ball 70 has been melted to join the bonding pad 55 and the lead wiring pad 56.

A molten solder 71 spreads over both the bonding surface of the bonding pad 55 and the bonding surface of the lead wiring pad 56 because of wettability of the solder involved. The molten solder 71 is then formed into a shape of joining the two pads. The molten solder 71 spreads over an entire surface on top of the bonding surface of the bonding pad 55 and the bonding surface of the lead wiring pad 56. If the two pads are joined in an inverted arch shape as shown in FIG. 7, a fillet 71 exhibiting a good joining condition is formed. To achieve such a good joining condition as that shown in FIG. 7, it is necessary that the solder ball 70 be disposed at a location near a centerline in a side face direction (a virtual right-angled axis direction) in each of the two pads.

Figure 13:
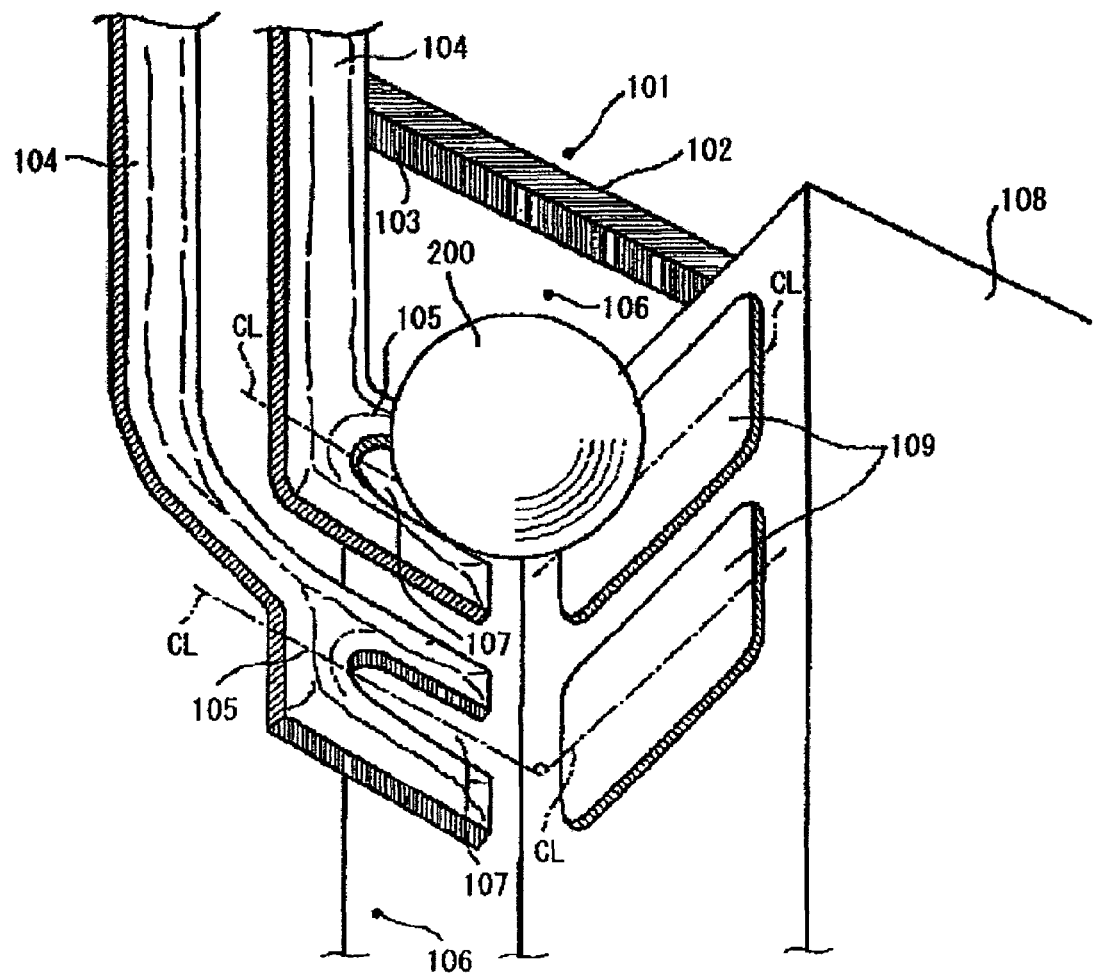
FIG. 13 is an enlarged perspective view showing a major portion in the conventional integrated wire suspension.
Figure 14:
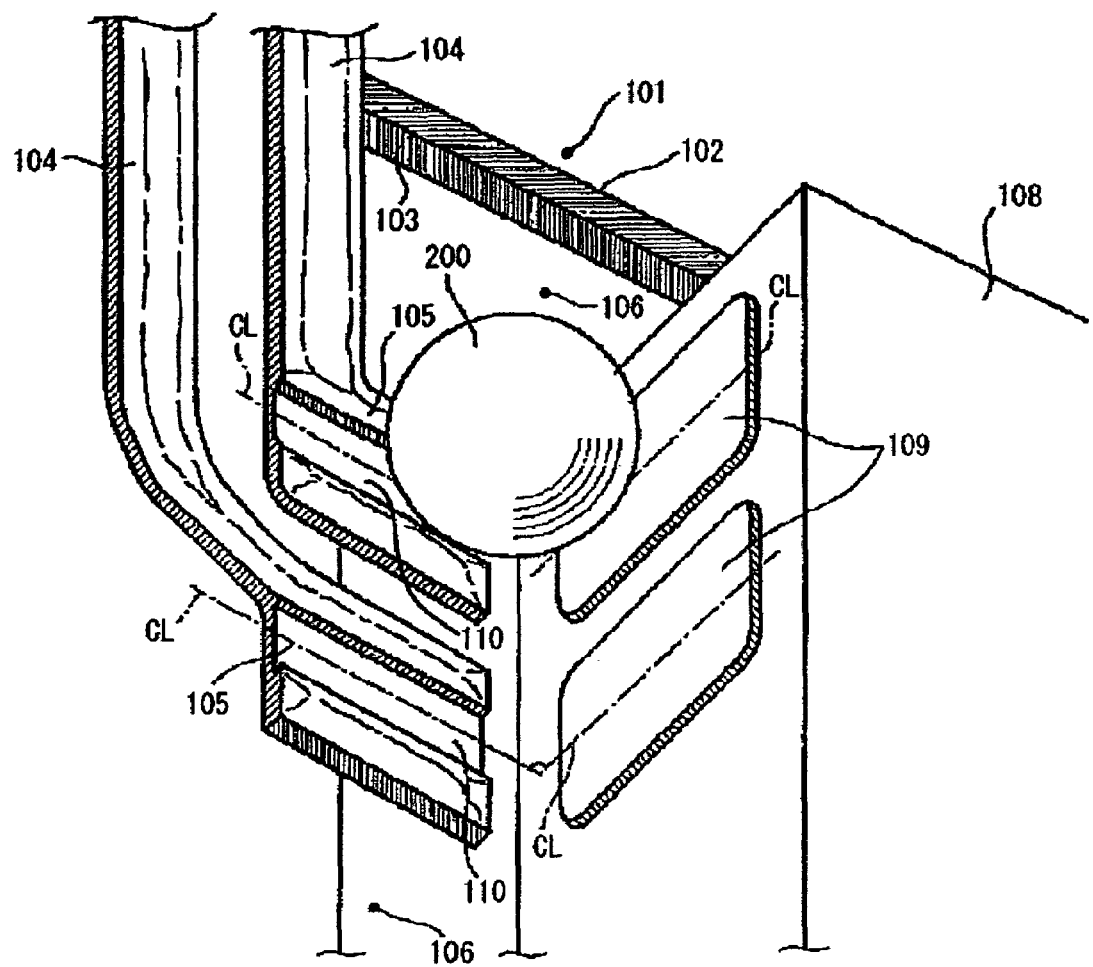
FIG. 14 is an enlarged perspective view showing a major portion in the conventional integrated wire suspension.

The only difference of the lead wiring pad 56 of the HSA 41 from that used in the conventional integrated wire suspensions shown in FIGS. 13 and 14 is the construction of the lead wiring pad 56 as shown in FIG. 1. Other arrangements of the integrated wire suspension according to embodiments of the present invention are the same as those found in the conventional integrated wire suspensions shown in FIGS. 13 and 14.

In the HSA 41 of the FPC type, the lead wiring pad 56 is formed by covering a required portion of the Cu (copper) foil layer with resist and etching the rest, before removing the resist. The lead wiring pad 56 of the subtractive type called the ILS is formed as follows. Specifically, a laminated structure is first formed by laminating together the Cu (copper) foil layer as the metal layer, a polyimide layer 57 as the dielectric layer, and a stainless steel foil layer 58 as the conductor layer. A required portion of the Cu (copper) foil layer of the laminated structure then covered with resist and the rest is etched before the resist is finally removed. The lead wiring pad 56 of the additive type called a CIS (Circuit Integrated Suspension) is formed as follows. Specifically, a seed layer is formed through spattering on top of the polyimide layer 57. Portions other than the required on the seed layer are covered with resist and the entire surface is subjected to Cu (copper) plating. Resist is thereafter removed to form the lead wiring pad 56. At this time, a through slot 56a is formed in an area near a centerline on the front surface of the lead wiring pad 56. The through slot 56a prevents the solder ball 70, which has been dropped from the front surface of the lead wiring pad 56, from rolling to deviate from the centerline. With the lead wiring pad 56 provided with the through slot 56a, the portion at which the through slot 56a is made protrudes into the opening portion 54 of the flexure 46.

Figure 8:
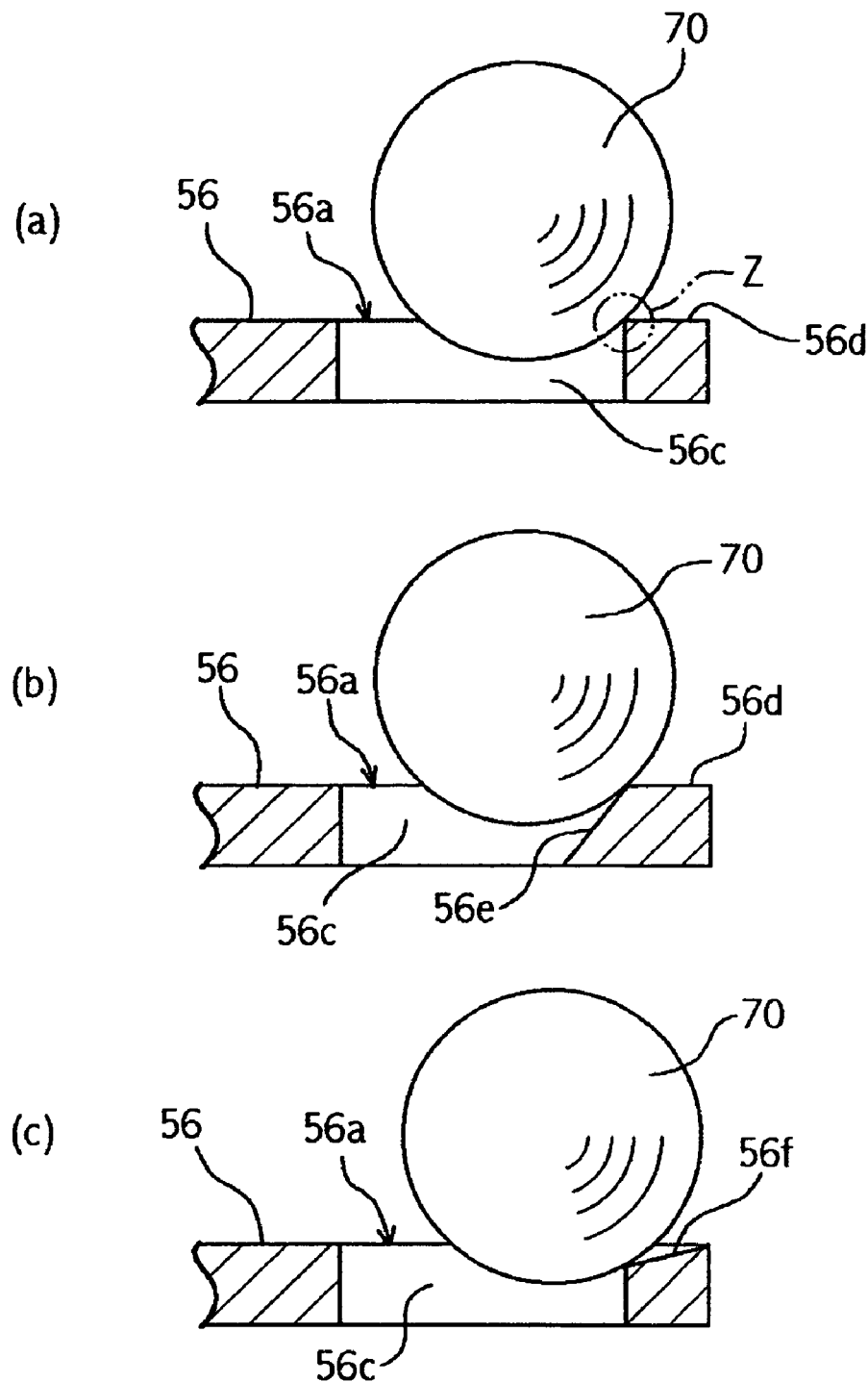
FIGS. 8(a) to 8(c) are cross-sectional views showing relationship between the shape of the through slot provided in the lead wiring pad of the head suspension assembly according to embodiments of the present invention and the solder ball.

The through slot 56a includes the following components. The components include, specifically: positioning portions 56b, 56b' for positioning the solder ball 70 in the vertical direction relative to the centerline CL of the lead wiring pad 56; a through opening 56c having the positioning portions 56b, 56b' as edges; and a contact area 56d in contact with the solder ball 70 provided on the head/slider side of the through opening 56c. The positioning portions 56b, 56b' in the through opening 56c include an edge side 56b and an opposing edge side 56b' that run parallel with the centerline CL of the lead wiring pad 56. The edge side 56b and the opposing edge side 56b' are provided substantially symmetrically relative to the centerline CL of the lead wiring pad 56 to ensure that a center of the solder ball 70 substantially coincides. In addition, the contact area 56d in contact with the solder ball 70 meets the following requirements. Specifically, when the solder ball 70 is placed in contact with each of the bonding surfaces of the bonding pad 55 and the lead wiring pad 56 and comes to a standstill, the contact area 56d is a portion Z that can make contact with the solder ball 70 as shown in FIG. 8(a). The portion Z is an area that is first wet by the solder when the solder ball 70 is heated and melted by the laser beam 80.

Because of a space formed by the through slot 56a as described in the foregoing, the solder ball 70 is dropped into the through opening 56c between the edge side 56b and the opposing edge side 56b' by gravity. The center of the solder ball 70 is then substantially aligned with the centerline CL on the through opening 56c. The solder ball 70 is thereby temporarily secured in position so that the ball does not move in the virtual right-angled axis direction between the two pads. As a result, should any stress in the virtual right-angled axis direction (in the direction of A or B shown in FIG. 1) be applied to the solder ball 70 by introduction of the nitrogen gas or the like, or vibration or the like produced when the optical equipment 10 moves, there is no chance that the solder ball 70 will move.

For the width dimension of a portion in parallel with the centerline CL in the through opening 56c, the following guidelines may be used. Specifically, the lead wiring pad 56 is, for example, about 148 μm wide and, if the solder ball 70 has a diameter of 120 μm, the width dimension of the portion in parallel with the centerline CL may be half (74 μm) or ⅓ (about 49 μm) of the width of the lead wiring pad 56.

If the solder ball 70 is temporarily secured after being dropped in a space between the edge side 56b and the opposing edge side 56b' in the through opening 56c by gravity, the contact area 56d in contact with the solder ball 70 of the through slot 56a makes contact with the solder ball 70. The solder ball 70 dropped between the bonding pad 55 and the lead wiring pad 56 is irradiated with the laser beam 80 and thus melted in this condition. When the solder ball 70 is thus melted, the solder spreads in the contact area 56d in contact with the solder ball 70 because of wettability thereof. The molten solder can then spread over both the bonding surface of the bonding pad 55 and the bonding surface of the lead wiring pad 56 because of wettability of the solder. This allows the two pads to be properly joined together without allowing any soldering problems to develop. A good soldered joint can therefore be obtained.

The through slot 56a can have a greater area of contact with the solder ball 70, if the contact area 56d in contact with the solder ball 70 is defined as an arcuate edge portion. The area of contact with the solder ball 70 can be made even larger by the following arrangements. Specifically, referring to FIGS. 8(b) and 8(c), inclined surfaces 56e, 56f inclining from the side, from which the solder ball 70 is dropped, toward a portion away from the slider 52, are provided at an end portion of the arc in a depth direction of the through slot 56a.

The through slot 56a is completely extended through in a thickness direction of the lead wiring pad 56. In the subtractive type manufacturing method, an outline of the through slot can be formed at the same time in which the lead wiring pad is formed, using a single resist mask. The manufacturing process for forming the outline of the lead wiring pad can also be used to form the through slot.

Figure 9:
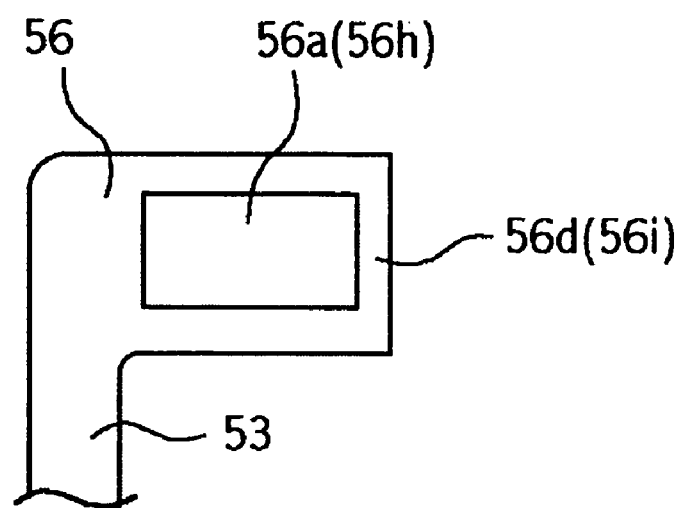
FIG. 9 is a plan view showing the shape of the through slot (recess), as viewed from the above, provided in the lead wiring pad of the head suspension assembly according to embodiments of the present invention.
Figure 10:
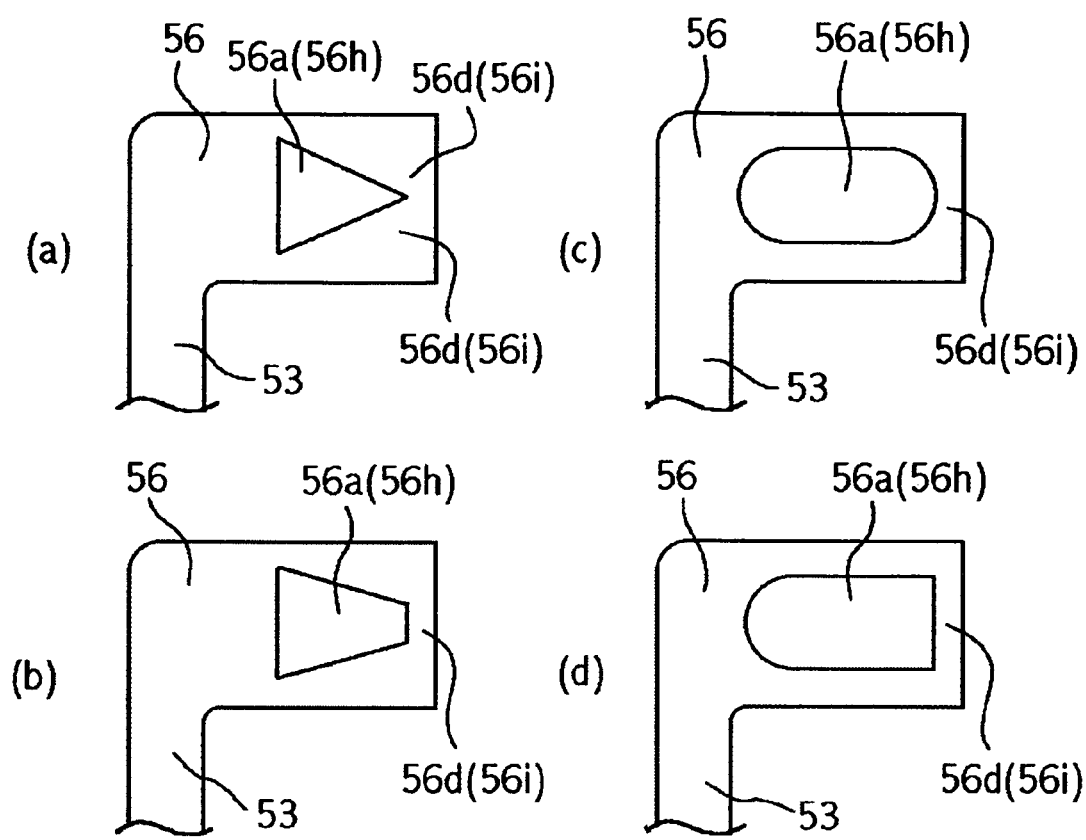
FIGS. 10(a) to 10(d) are plan views showing different shapes of the through slot (recess), as viewed from the above, provided in the lead wiring pad of the head suspension assembly according to embodiments of the present invention.
Figure 11:
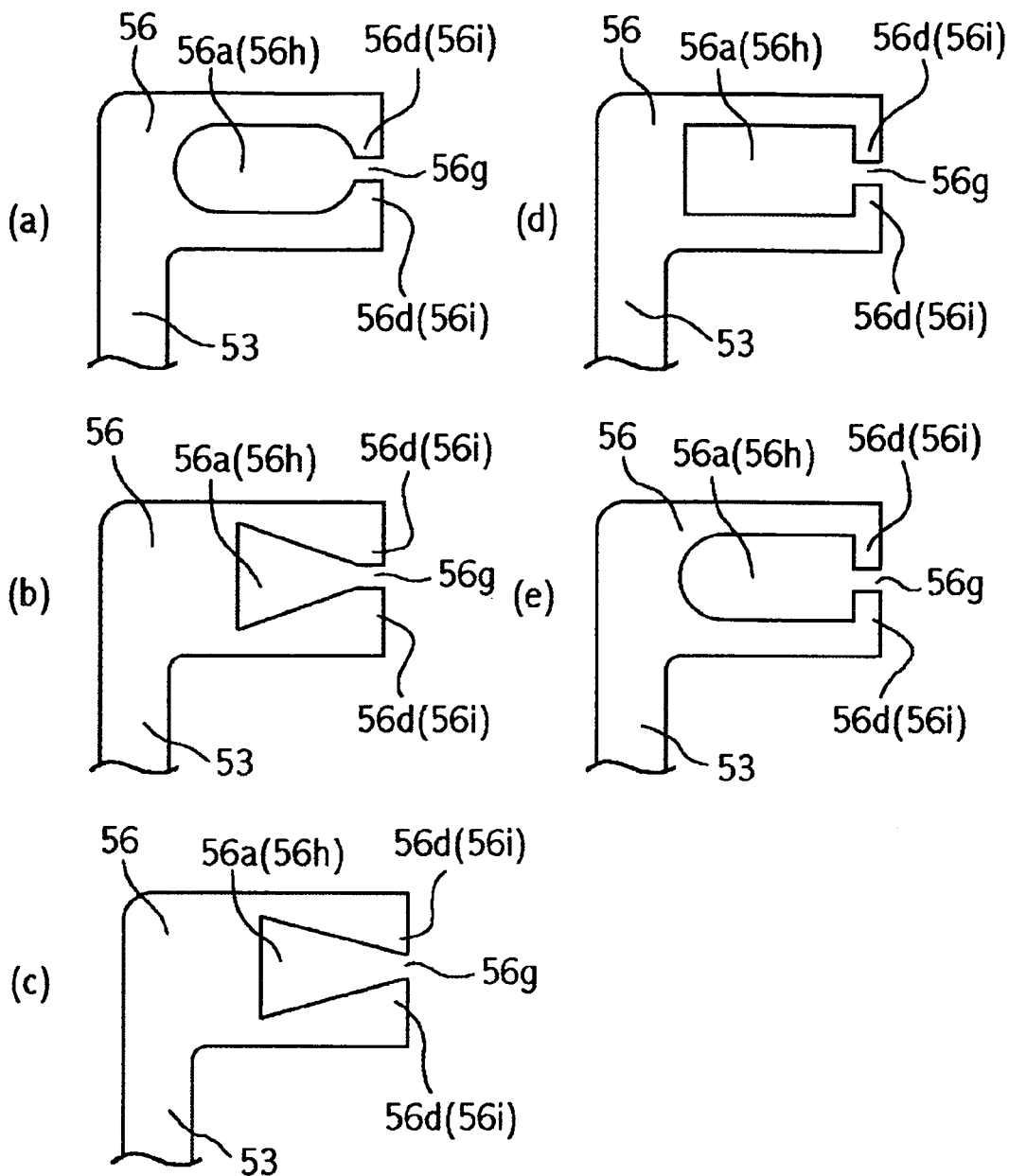
FIGS. 11(a) to 11(e) are plan views showing different shapes of the through slot (recess), as viewed from the above, including a slit at a leading end thereof and provided in the lead wiring pad of the head suspension assembly according to embodiments of the present invention.

The shape of the through slot 56a in the lead wiring pad 56 can be varied in many different ways, if the contact area 56d in contact with the solder ball 70 is provided at the leading end portion of the lead wiring pad 56. The through slot 56a may, for example, be shaped as a rectangle as shown in FIG. 9. The shape may also be such that the portion far away from the head/slider 52 is wider than the portion near the head/slider 52. A triangle and a trapezoid as shown in FIGS. 10(a) and 10(b) are possible for the shape that has the portion far away from the head/slider 52 wider than the portion near the head/slider 52. Such a shape as the triangle or the trapezoid allows the area of contact with the solder ball 70 in the contact area 56d in contact with the solder ball 70 to be made greater. The through slot 56a in the lead wiring pad 56 shown in FIG. 1 has an oblong shape as shown in FIG. 10(c). Still another shape is a U shape as shown in FIG. 10(d), in which the leading end direction of the lead wiring pad 56 is blocked by a straight shape serving as the contact area 56d in contact with the solder ball 70.

The shape of the through slot 56a in the lead wiring pad 56 may have a slit 56g cut out on the head/slider side having the various shapes as described in the foregoing. Different shapes having the slit 56g therein are depicted in FIGS. 11(a) through 11(e). The contact area 56d in contact with the solder ball 70 can be secured even in shapes having these slits 56g. This allows the molten solder to spread by way of the wettability of the solder. The slit 56g is cut out at the leading end portion in each of different shapes of the through slot 56a in the lead wiring pad 56. The different shapes are: an oblong in FIG. 11(a); a triangle in FIG. 11(b); a trapezoid in FIG. 11(c); a rectangle in FIG. 11(d); and a U shape, in FIG. 11(e), with the leading end direction of the lead wiring pad 56 blocked by a straight shape serving as the contact area 56d in contact with the solder ball 70.

Figure 12:
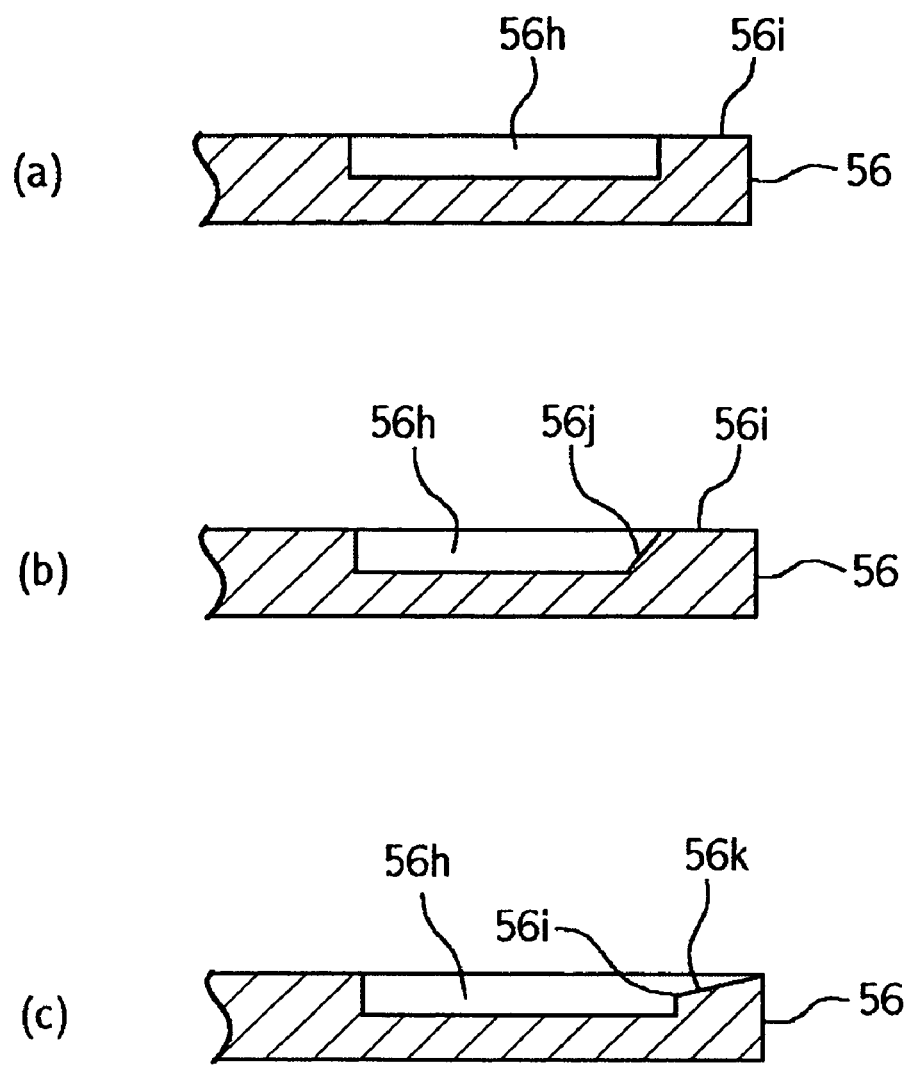
FIGS. 12(a) to 12(c) are cross-sectional views showing different shapes of the recess provided in the lead wiring pad of the head suspension assembly according to embodiments of the present invention.

In accordance with the embodiment of the present invention described in the foregoing, the through slot 56a for positioning the solder ball 70 used for connection to the head/slider 52 is provided in the lead wiring pad 56. It is to be understood that the present invention is not limited to this configuration only. Rather, as shown in FIG. 12(a), the lead wiring pad 56 may include a recess 56h that is indented from a front surface of the lead wiring pad 56. The lead wiring pad 56 may also include a contact area 56i in contact with the solder ball 70 that is provided on an end portion of the lead wiring pad 56 on the slider side and that defines an edge for the recess 56h.

Like the through opening 56c described earlier, the recess 56h has an edge side and an opposing edge side that run parallel with the centerline CL of the lead wiring pad 56. Also like the through opening 56c described earlier, the edge side and the opposing edge side are provided substantially symmetrically relative to the centerline CL of the lead wiring pad 56 to ensure that the center of the solder ball 70 substantially coincides. Furthermore, like the through opening 56c described earlier, the contact area 56i in contact with the solder ball 70 is a portion that can make contact with the solder ball 70 when the solder ball 70 is placed in contact with each of the bonding surfaces of the bonding pad 55 and the lead wiring pad 56 and comes to a standstill. This portion is an area that is first wet by the solder when the solder ball 70 is heated and melted by the laser beam 80.

Due to a space formed by the recess 56h, the solder ball 70 is dropped into the recess 56h between the edge side and the opposing edge side by gravity. The center of the solder ball 70 is then substantially aligned with the centerline CL on the recess 56h. The solder ball 70 is thereby temporarily secured in position so that the ball does not move in the virtual right-angled axis direction between the two pads. As a result, should any stress in the virtual right-angled axis direction (in the same direction shown in FIG. 1) be applied to the solder ball 70 by introduction of the nitrogen gas or the like, or vibration or the like produced when the optical equipment 10 moves, there is no chance that the solder ball 70 will move.

For the width dimension of a portion in parallel with the centerline CL in the recess 56h, the following guidelines may be used, again like the through opening 56c described earlier. Specifically, the lead wiring pad 56 is, for example, about 148 µm wide and, if the solder ball 70 has a diameter of 120 µm, the width dimension of the portion in parallel with the centerline CL may be half (74 µm) or ⅓ (about 49 µm) of the width of the lead wiring pad 56.

If the solder ball 70 is temporarily secured after being dropped in a space between the edge side and the opposing edge side in the recess 56h by gravity, the contact area 56i in contact with the solder ball 70 of the recess 56h makes contact with the solder ball 70. The solder ball 70 dropped between the bonding pad 55 and the lead wiring pad 56 is irradiated with the laser beam 80 and thus melted in this condition. When the solder ball 70 is thus melted, the solder spreads in the contact area 56i in contact with the solder ball 70 because of wettability thereof. The molten solder can then spread over both the bonding surface of the bonding pad 55 and the bonding surface of the lead wiring pad 56. A bottom surface in the recess 56h can also be touched by the solder ball 70. This allows the two pads to be properly joined together without allowing any soldering problems to develop. A good soldered joint can therefore be obtained.

The recess 56h can have a greater area of contact with the solder ball 70, if the contact area 56i in contact with the solder ball 70 is defined as an arcuate edge portion as shown in FIG. 10(c). The area of contact with the solder ball 70 can be made even larger by the following arrangements. Specifically, referring to FIGS. 12(b) and 12(c), inclined surfaces 56j, 56k inclining from the side, from which the solder ball 70 is dropped, toward a portion away from the slider 52, are provided at an end portion of the arc, in a depth direction of the recess 56h.

The recess 56h such as that described above is formed through half etching to ensure that the recess is not extended through. The additive type is therefore preferable for the manufacturing method employed.

The shape of the recess 56h in the lead wiring pad 56 can be varied in many different ways, if the contact area 56i in contact with the solder ball 70 is provided at the leading end portion of the lead wiring pad 56. The recess 56h may, for example, be shaped as a rectangle as shown in FIG. 9. The shape may also be such that the portion far away from the head/slider 52 is wider than the portion near the head/slider 52. A triangle and a trapezoid as shown in FIGS. 10(a) and 10(b) are possible for the shape that has the portion far away from the head/slider 52 wider than the portion near the head/slider 52. Such a shape as the triangle or the trapezoid allows the area of contact with the solder ball 70 in the contact area 56i in contact with the solder ball 70 to be made greater.

The shape of the recess 56h in the lead wiring pad 56 may have the slit 56g cut out on the head/slider side having the various shapes as described in the foregoing. Different shapes having the slit 56g therein are depicted in FIGS. 11(a) through 11(e). The contact area 56i in contact with the solder ball 70 can be secured even in shapes having these slits 56g. This allows the molten solder to spread through wettability of the solder.

In each of the embodiments of the present invention described in the foregoing, the HSA 41 is the integrated wire type including, as the major components thereof, the base plate 43, the load beam 44, the suspension plate 45, and the flexure 46. The arrangement is not limited to this. Rather, a magnetic head of any configuration should serve the purpose as long as the magnetic head can read data from and write data onto the magnetic disk 3, or either read data from or write data onto the magnetic disk 3.

It is to be understood that the above description is intended to be illustrative and not restrictive. Many embodiments will be apparent to those of skill in the art upon reviewing the above description. The scope of the invention should, therefore, be determined not with reference to the above description, but instead should be determined with reference to the appended claims alone with their full scope of equivalents.

What is claimed is:

1. A rotating disk storage device, comprising:
   a rotating disk storage medium;
   a head/slider including a head for accessing the rotating disk storage medium and a slider mounted with the head; and
   a head suspension assembly including a mounting portion of the head/slider, wires connected to the head/slider, and a lead wiring pad forming an end portion of the wires;
   wherein the lead wiring pad includes a through slot for positioning a solder ball used for connection to the head/slider, and
   wherein the through slot has an end part on a side of the head/slider, the end part having an inclined surface inclining, in a depth direction of the through opening, from a side, from which the solder ball is to be dropped, toward a portion away from the head/slider.

2. The rotating disk storage device according to claim 1, wherein the through slot has an edge side and an opposing edge side that run parallel with a centerline of the lead wiring pad.

3. The rotating disk storage device according to claim 2, wherein the through slot has an arcuate end portion in the through slot on a side of the head/slider.

4. The rotating disk storage device according to claim 3, wherein the arcuate end portion has an inclined surface inclining, in a depth direction of the through slot, from a side, from which the solder ball is to be dropped, toward a portion away from the head/slider.

5. The rotating disk storage device according to claim 1, wherein the head suspension assembly includes a laminated structure of a metal layer, a dielectric layer, and a conductor layer, and the through slot extends through only the conductor layer.

6. The rotating disk storage device according to claim 1, wherein the through slot has a shape of a triangle or a rectangle.

7. The rotating disk storage device according to claim 1, wherein the through slot is symmetrical relative to a centerline of the lead wiring pad.

8. The rotating disk storage device according to claim 1, wherein the head suspension assembly is a subtractive type.

9. A rotating disk storage device, comprising:
   a rotating disk storage medium;
   a head/slider including a head for accessing the rotating disk storage medium and a slider mounted with the head; and
   a head suspension assembly including a mounting portion of the head/slider, wires connected to the head/slider, and a lead wiring pad forming an end portion of the wires;
   wherein the lead wiring pad includes a positioning portion configured to position in a vertical direction a solder ball relative to a centerline of the lead wiring pad, a through opening having the positioning portion as an edge, and an area of contact with the solder ball provided at an end part on a side of the head/slider in the through opening and
   wherein the end part has an inclined surface inclining, in a depth direction of the through opening, from a side, from which the solder ball is to be dropped, toward a portion away from the head/slider.

10. A rotating disk storage device, comprising:
    a rotating disk storage medium;
    a head/slider including a head for accessing the rotating disk storage medium and a slider mounted with the head; and
    a head suspension assembly including a mounting portion of the head/slider, wires connected to the head/slider, and a lead wiring pad forming an end portion of the wires;
    wherein the lead wiring pad includes a recess indented from a front surface of the lead wiring pad for positioning a solder ball used for connection to the head/slider, and an area of contact with the solder ball provided at an end portion on a side of the head/slider in the lead wiring pad and serving as an edge of the recess, and
    wherein the end portion has an inclined surface inclining, in a depth direction of the recess, from a side, from which the solder ball is to be dropped, toward a portion away from the head/slider.

11. The rotating disk storage device according to claim 10, wherein the recess has an edge side and an opposing edge side that run parallel with a centerline of the lead wiring pad.

12. The rotating disk storage device according to claim 10, wherein the head suspension assembly includes a laminated structure of a metal layer, a dielectric layer, and a conductor layer, and the recess indents only the conductor layer.

13. The rotating disk storage device according to claim 10, wherein the head suspension assembly is an additive type.

14. An integrated wire head suspension assembly including a lead wiring pad formed on an end portion of a wiring pattern comprising:
    a metal layer;
    a dielectric layer laminated on the metal layer; and
    a conductor layer laminated on the dielectric layer;
    wherein the lead wiring pad includes a through slot for positioning a solder ball used for connection to slider mounted with a head for accessing a rotating disk storage medium, and
    wherein the through slot in the lead wiring pad includes a positioning portion configured to position the solder ball in a vertical direction relative to a centerline of the lead wiring pad, a through opening having the positioning portion as one edge, and an area of contact with the solder ball provided on an end portion of the lead wiring pad on a side of the head and forming another edge on the side of the head of the through opening.

15. The integrated wire head suspension assembly according to claim 14,
wherein the through slot in the lead wiring pad has a width wider in a portion far away from the head than in a portion close to the head.

16. An integrated wire head suspension assembly including a lead wiring pad formed on an end portion of a wiring pattern comprising:
a metal layer;
a dielectric layer laminated on the metal layer; and
a conductor layer laminated on the dielectric layer;
wherein the lead wiring pad includes a through slot for positioning a solder ball used for connection to a slider mounted with a head for accessing a rotating disk storage medium, and
wherein the through slot has an end part on a side of the slider, the end part having an inclined surface inclining, in a depth direction of the through opening, from a side, from which the solder ball is to be dropped, toward a portion away from the slider.

17. The integrated wire head suspension assembly according to claim 16,
wherein the through slot in the lead wiring pad includes a positioning portion configured to position the solder ball in a vertical direction relative to a centerline of the lead wiring pad, a through opening having the positioning portion as one edge, and an area of contact with the solder ball provided on an end portion of the lead wiring pad on a side of the head and forming another edge on the side of the head of the through opening.

* * * * *

UNITED STATES PATENT AND TRADEMARK OFFICE
CERTIFICATE OF CORRECTION

PATENT NO. : 7,583,475 B2 Page 1 of 1
APPLICATION NO. : 11/066949
DATED : September 1, 2009
INVENTOR(S) : Matsumoto et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1222 days.

Signed and Sealed this

Fourteenth Day of September, 2010

David J. Kappos
*Director of the United States Patent and Trademark Office*